United States Patent
Subramaniam et al.

(10) Patent No.: US 7,129,735 B2
(45) Date of Patent: Oct. 31, 2006

(54) METHOD FOR TEST DATA-DRIVEN STATISTICAL DETECTION OF OUTLIER SEMICONDUCTOR DEVICES

(75) Inventors: Suresh Subramaniam, Richardson, TX (US); Kenneth M. Butler, Richardson, TX (US); John M. Carulli, Richardson, TX (US); Richard A. Lawrence, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/938,488

(22) Filed: Sep. 10, 2004

(65) Prior Publication Data

US 2006/0028229 A1    Feb. 9, 2006

Related U.S. Application Data

(60) Provisional application No. 60/590,093, filed on Jul. 21, 2004.

(51) Int. Cl.
 G01R 31/26    (2006.01)
(52) U.S. Cl. .................................................. 324/765
(58) Field of Classification Search ............... 324/760, 324/765, 158.1; 438/14, 17; 702/108, 117, 702/118

See application file for complete search history.

(56) References Cited

U.S. PATENT DOCUMENTS

| | | | |
|---|---|---|---|
| 6,184,048 B1 * | 2/2001 | Ramon | 438/14 |
| 6,476,631 B1 | 11/2002 | Madge | |
| 6,532,431 B1 | 3/2003 | Madge | |
| 6,598,194 B1 | 7/2003 | Madge et al. | |
| 6,601,008 B1 | 7/2003 | Madge | |
| 6,647,348 B1 | 11/2003 | Madge | |
| 6,792,373 B1 * | 9/2004 | Tabor | 702/108 |

* cited by examiner

*Primary Examiner*—Ha Tran Nguyen
*Assistant Examiner*—Tung X. Nguyen
(74) *Attorney, Agent, or Firm*—Alan K. Stewart; W. James Brady; Frederick J. Telecky, Jr.

(57) ABSTRACT

A method for test data-driven detection of outlier semiconductor devices. Some illustrative embodiments may be a method used to test a semiconductor die comprising performing a burn-in test of a plurality of sample semiconductor dies to identify a failure of a defective semiconductor die, correlating variations in a parameter with the failure (the parameter comprising a characteristic associated with the plurality of sample semiconductor dies), defining a parameter constraint associated with the parameter, performing a production test of a production semiconductor die, and identifying the production semiconductor die as an outlier semiconductor die (the outlier semiconductor die passing the production test, but failing to conform to the parameter constraint).

9 Claims, 2 Drawing Sheets

METHOD FOR TEST DATA-DRIVEN STATISTICAL DETECTION OF OUTLIER SEMICONDUCTOR DEVICES

CROSS-REFERENCE TO RELATED APPLICATIONS

This application is a non-provisional application claiming priority to provisional application Ser. No. 60/590,093 filed on Jul. 21, 2004 and entitled Procedure For Arriving At Test Data-Driven Statistical Approach To Outlier Detection, which is hereby incorporated by reference.

BACKGROUND

1. Technical Field

The present subject matter relates to predicting reliability failures of semiconductor devices. More particularly, the subject matter relates to collecting test data from burn-in tests of sample groups of semiconductor devices, and then using the data to statistically predict reliability failures within a general population of semiconductor parts.

2. Background

Semiconductor devices may be fabricated on the surface of a semiconductor wafer in layers and later cut into individual dies. The individual dies thus fabricated are subjected to a series of tests to determine if the dies function properly both before and after being cut. These tests are sometimes repeated at several points in the manufacturing process, since the steps involved in cutting and packaging the dies can result in thermal and mechanical stresses which can induce failures of individual dies. The tests are designed to identify parts that are actually failing when tested, a failure sometimes referred to as a "time-zero" failure.

But many failures that occur in semiconductor dies are not "time-zero" failures, but failures that occur later after the dies have been in operation for a short time. These failures, sometimes referred to as "infant-mortality" or "early" failures, are sometimes identified through the use of a "burn-in" process, in which the dies are operated for an extended period (compared to the duration of normal production testing) beyond the electrical and environmental ranges defined by the design engineers for normal operation. This operational test period may identify a significant number of failures, but this is accomplished at the expense of the additional cost of testing, as well as a reduced life expectancy of the dies tested.

Some manufacturers have used a "no burn-in" approach, using time-zero failures to predict early failures without a production burn-in. Using time-zero failures to predict marginal dies, however, does not always predict failures of dies that are defective. These unpredicted "statistical outliers" tend to increase in number as the dimensions of the semiconductor structures within the dies decrease, and are thus not reliably predicted by time-zero-based no burn-in techniques when applied to many of today's sub-micron semiconductor devices.

SUMMARY

The problems noted above are addressed in large part by a method for test data-driven detection of outlier semiconductor devices. Some illustrative embodiments may be a method used to test a semiconductor die comprising performing a burn-in test of a plurality of sample semiconductor dies to identify a failure of a defective semiconductor die, correlating variations in a parameter with the failure (the parameter comprising a characteristic associated with the plurality of sample semiconductor dies), defining a parameter constraint associated with the parameter, performing a production test of a production semiconductor die, and identifying the production semiconductor die as an outlier semiconductor die (the outlier semiconductor die passing the production test, but failing to conform to the parameter constraint).

Other illustrative embodiments may be a method used to test a semiconductor die comprising defining a parameter describing a characteristic of a plurality of sample semiconductor dies, executing a burn-in test of the plurality of sample semiconductor dies to identify a failure of a defective semiconductor die, generating a plurality of parameter constraints from correlations between the failure and variations of the parameter, reducing the number of parameter constraints within the plurality of parameter constraints, executing a production test of a production semiconductor die, and identifying as an outlier semiconductor die a production semiconductor die that passes the production test, but fails to conform to a parameter constraint included in the plurality of parameter constraints.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following discussion and claims to refer to particular system components. This document does not intend to distinguish between components that differ in name but not function.

In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more parts and may be used to refer to a computer system or a portion of a computer system.

DETAILED DESCRIPTION OF THE PREFERRED EMBODIMENTS

Semiconductor manufacturers have found that it is preferable to statistically predict reliability failures of production semiconductor dies rather than force the failures through burn-in testing of the dies (also sometimes referred to as "accelerated life testing"). Such reliability failures occur in dies that pass production testing, but later fail after being subjected to the stress of being operated. Most semiconductor dies that experience such reliability failures are thought to be "statistical outliers." Semiconductor manufacturers sometimes use production test failures (also known as "time-zero" failures) as a statistical basis for predicting future reliability failures. But the use of time-zero failures as a basis for identifying statistical outliers has proven inadequate for the current generation of semiconductor dies. This is due to the fact that as the dimensions of the structures within the dies decrease, the correlation between time-zero failures and reliability failures also decreases. Actual reliability failures can provide an improved statistical basis for identifying statistical outliers.

Figure 1:
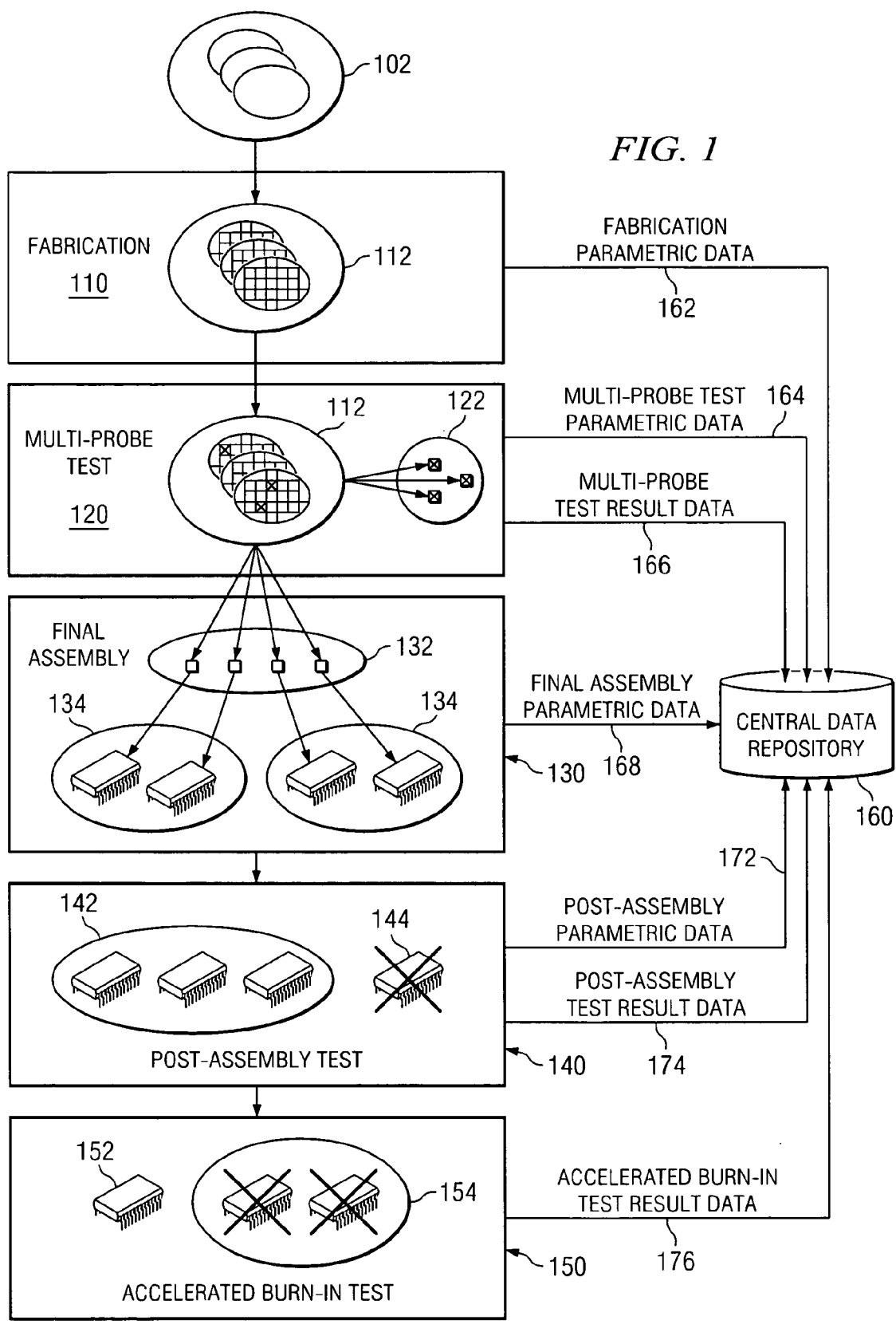
FIG. 1 illustrates the collection of data used to identify statistical outliers in accordance with at least some of the preferred embodiments of the invention.

FIG. 1 illustrates how parametric and test result data may be gathered from a sample group for use in identifying statistical outliers in a production group. Starting at fabrication 110, a sample group 112 of semiconductor dies is manufactured using wafers 102. Fabrication parametric data 162 for the sample group 112 may be saved in a central data repository 160 in accordance with the preferred embodiments. The central data repository 160 may comprise one or more centrally located computer systems, each with a non-volatile storage device used to store parametric data collected at each stage of the manufacturing process.

Parametric data may describe or otherwise be associated with a characteristic that comprises a measured or observed feature of a semiconductor die or test structure outside the die (e.g., a scribeline test structure), or of any operation performed on a semiconductor die, or of any machine or process used to perform an operation on a semiconductor die. Such parametric data may be collected at any point during the manufacture and packaging of the semiconductor die. The fabrication parametric data 162, for example, may include any suitable parameter such as process type, number of layers, number of masks, target threshold voltages, doping concentrations, temperatures and humidity during each processing step, and visual inspection results.

Following fabrication, the sample group 112 is subjected to a multi-probe test 120 in which the individual dies on each wafer of the sample group 112 are tested. Multi-probe test 120 may comprise tests that identify those dies that do not function within the functional and electrical parameters defined by the design engineers (multi-probe time-zero failures 122). In the preferred embodiments, the multi-probe test result data 166 from the multi-probe testing 120, as well as the multi-probe test parametric data 164, may be saved in the central data repository 160. The multi-probe test parametric data 164 may include die position within a wafer, wafer identification, type of test equipment used, test program used, and time and date of testing.

After completion of multi-probe test 120, the dies within each wafer are singulated (i.e., separated from each other) into individual sample dies. The sample dies identified as the multi-probe time-zero failures 122 are separated from the sample group 112 and may be scrapped or may undergo additional testing or analysis. The remaining sample dies 132 that passed multi-probe testing are sent to final assembly 130. Final assembly parametric data 168 may be saved in the central data repository 160 in accordance with the preferred embodiments. The final assembly parametric data 168 may include packaging type, assembly equipment used, bonding method used, and time and date of assembly.

After final assembly 130 is complete, the packaged sample dies 134 proceed to post-assembly test 140. Post-assembly test 140 may include tests similar to those executed during multi-probe test 120, and is also used to identify those packaged sample dies 134 that do not function within the functional and electrical parameters defined by the design engineers (post-assembly time-zero failures 144). In the preferred embodiments, the post-assembly test result data 174 from the post-assembly testing 140, as well as post-assembly parametric data 172, may be saved in the central data repository 160. The post-assembly parametric data 172 may include data similar to the multi-probe test parametric data 164.

After completion of post-assembly testing 140 the post-assembly time-zero failures 144 are separated from the packaged sample dies 134, and may be scrapped or may undergo additional testing or analysis. The packaged dies that passed post-assembly testing (burn-in sample group 142) are sent to the accelerated burn-in test 150. The accelerated burn-in test 150 subjects the burn-in sample group 142 to environmental and electrical conditions beyond the ranges defined by the design engineers for normal operation (i.e., as described in the design specification or "data sheet" for the semiconductor die). This type of testing is done in order to force failures of dies within the burn-in sample group 142 with a reliability risk, and to force the failures within a relatively short period of time (when compared to the life expectancy of a semiconductor die operated within its normal operating range). These reliability failures are identified through repeated testing (similar to the testing done during both multi-probe and post-assembly testing) and may be performed before, during and after variations in environmental and electrical conditions are introduced into the test environment.

In the preferred embodiments, once the accelerated burn-in test 150 has been completed, the accelerated burn-in test data 176 is saved in the central data repository 160. Parametric and test result data saved in the central data repository 160, starting at die fabrication 110 and ending at post-assembly testing 140, may then be correlated with the accelerated burn-in test data 176 for packaged dies having similar failures. Statistical methods may be used to perform the correlation and may include, for example, linear and non-linear regression, reticle shot area statistical analysis, neighborhood or other zonal analysis, multivariate analysis, classification and regression tree, and iterative component analysis. Parameters with variations that have statistically significant correlations to particular failures may then be used to generate corresponding parameter constraints.

Parameter constraints may be compared with the multi-probe test results and other parametric data for a production die that otherwise has passed the multi-probe test (not a time-zero failure). If an applicable test result or other measured parameter for the production die violates a parameter constraint, the production die is identified as suspect and later separated from the production group. The suspect production die may then be scrapped, tested further, or analyzed.

Figure 2:
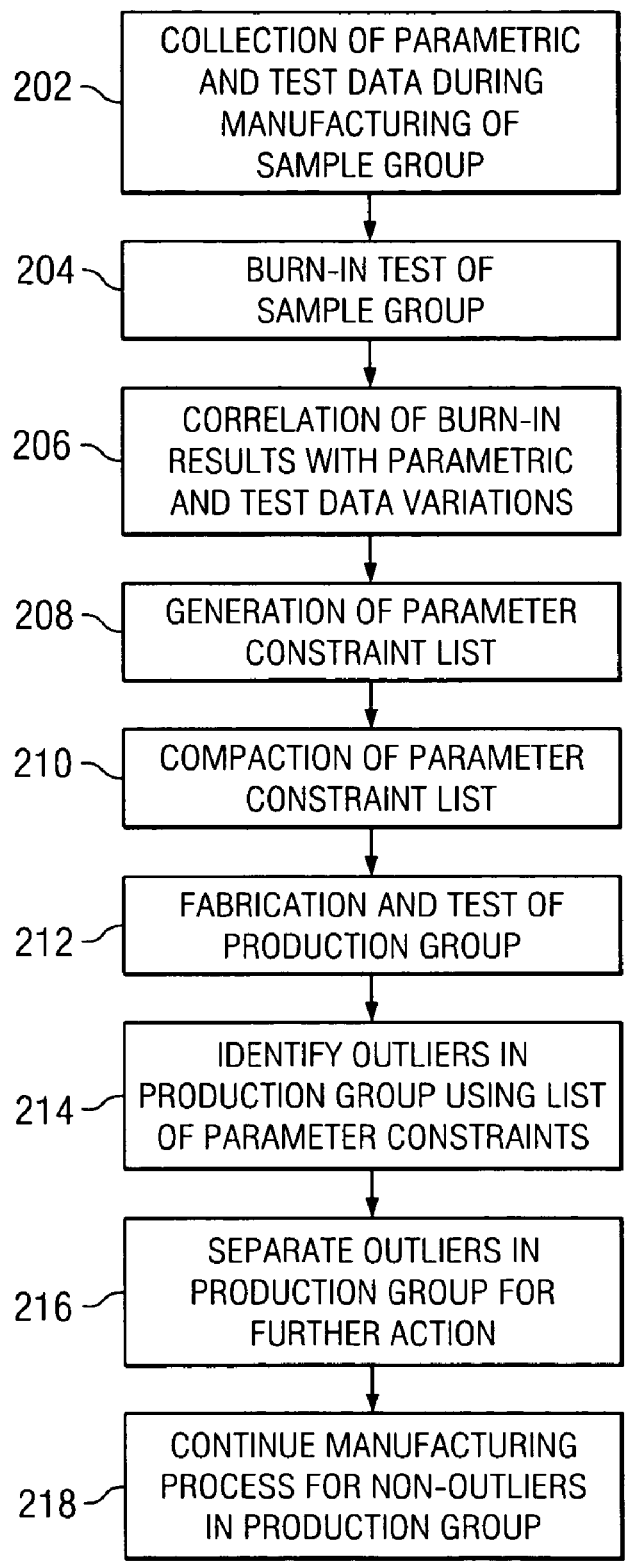
FIG. 2 illustrates a method for identifying statistical outliers in accordance with at least some of the preferred embodiments of the invention.

FIG. 2 illustrates a method 200 for identifying statistical outliers within a production group of semiconductor dies in accordance with the preferred embodiments. The method 200 uses collected and statistically processed parametric and test result data to identify statistical outliers. The necessary parametric and test data (as detailed above) is collected during the manufacturing of a sample group as shown in block 202. The functional dies within the sample group are subjected to an accelerated burn-in test as shown in block 204, which forces reliability failures to occur in a relatively short period of time. This burn-in test provides the base data used to characterize actual reliability failures for semiconductor dies within the sample group.

After the accelerated burn-in test has been completed, the parametric and test data that was collected during manufacturing is used to identify correlations between variations in the parametric and test data with the burn in test results for semiconductor dies that failed during the burn-in test, as shown in block 206. A list of parameter constraints is created in block 208, wherein each parameter constraint is based on a parameter variation with a statistically significant correlation to burn-in failures. The list of parameter constraints is then compacted down in block 210 to a subset of parameter constraints, using any one of a variety of statistical techniques (as described above). The compaction comprises removing parameter constraints from the list that have correlations to failures similar to the correlations of other parameter constraints. Such constraints may duplicate predictive information and thus may not be needed. The compaction may also comprise eliminating parameter constraints with correlations that are not statistically significant. The compaction is used to arrive at a reduced spanning set of parameter constraints that may be used to identify a die at risk of experiencing a reliability failure.

Once generated and compacted, the list of parameter constraints may be used in a production environment. After a production group of dies has completed fabrication and at least one production test (e.g., multi-probe) as shown in block 212, the test results of the production dies that have passed the production test are compared against the list of parameter constraints. If any of the test results of the production dies violates a parameter constraint, the violating production dies are identified as statistical outliers, as shown in block 214, and separated from the production group for additional action as shown in block 216. Such additional action may include scrapping, downgrading, and performing additional testing, analysis, and burn-in of the outliers. Once the outliers have been segregated, either physically or electronically, the remaining non-outlier production dies may then be allowed to continue through the manufacturing process as shown in block 218.

It should be noted that a parameter constraint may also be defined using multiple parameters. A parameter constraint so defined may be viewed as a "signature" which may be applied to the corresponding signature of a production device. Thus, a device that may not be identified as a statistical outlier when one parameter is considered in isolation may be identified as a statistical outlier when several parameters are considered together in the form of a signature. It should also be noted that the parametric data described in the above disclosure are illustrative of the many possible sources of parametric data that may be used. Any parameter that can be measured or observed during the manufacturing, testing and packaging of a semiconductor die may be used as a basis for a parameter constraint, so long as a statistically significant correlation can be established between variations in the parameter (or groups of parameters) and failures of semiconductor dies from within the sample group.

The above disclosure is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method used to test a semiconductor die, comprising:
   performing a burn-in test of a plurality of sample semiconductor dies to identify a failure of a defective semiconductor die;
   correlating variations in a parameter with the failure, the parameter describing a characteristic associated with the plurality of sample semiconductor dies;
   defining a parameter constraint associated with the parameter;
   performing a production test of a production semiconductor die; and
   identifying the production semiconductor die as an outlier semiconductor die, the outlier semiconductor die passing the production test, but failing to conform to the parameter constraint.

2. The method of claim 1, further comprising selecting the plurality of sample semiconductor dies for the burn-in test, the selection made after a post-assembly test of the plurality of sample semiconductor dies.

3. The method of claim 1, wherein performing the burn-in test comprises operating the plurality of sample semiconductor dies beyond a specified electrical operating range.

4. The method of claim 1, wherein performing the burn-in test comprises operating the plurality of sample semiconductor dies beyond a specified environmental operating range.

5. The method of claim 1, wherein performing the production test comprises performing a multi-probe test.

6. The method of claim 1, further comprising scrapping the outlier semiconductor die.

7. The method of claim 1, further comprising performing a separate burn-in test of the outlier semiconductor die.

8. The method of claim 1, further comprising downgrading the outlier semiconductor die.

9. The method of claim 1, wherein the characteristic associated with the plurality of sample semiconductor dies comprises describing a characteristic selected from a group consisting of a threshold voltage, a minimum power supply voltage, a maximum idle current, a number of processing masks, a type of processing, a type of testing equipment, a version of a test program, a type of packaging, a doping concentration for a processing step, a temperature for the processing step, and a die position within a wafer.

* * * * *